US011710786B2

(12) United States Patent
Ikeura et al.

(10) Patent No.: US 11,710,786 B2
(45) Date of Patent: Jul. 25, 2023

(54) SEMICONDUCTOR DEVICE (71) Applicant: DENSO CORPORATION, Kariya (JP)

(72) Inventors: Shogo Ikeura, Kariya (JP); Yusuke Nonaka, Kariya (JP); Shinichirou Yanagi, Kariya (JP)

(73) Assignee: DENSO CORPORATION, Kariya (JP)

( * ) Notice: Subject to any disclaimer, the term of this patent is extended or adjusted under 35 U.S.C. 154(b) by 43 days.

(21) Appl. No.: 16/952,446

(22) Filed: Nov. 19, 2020

(65) Prior Publication Data
US 2021/0074852 A1    Mar. 11, 2021

Related U.S. Application Data (63) Continuation of application No. PCT/JP2019/018570, filed on May 9, 2019.

(30) Foreign Application Priority Data

May 22, 2018  (JP) .................................. 2018-098071

(51) Int. Cl.
H01L 29/78      (2006.01)
H01L 23/528     (2006.01)
H01L 23/535     (2006.01)

(52) U.S. Cl.
CPC ........ *H01L 29/7816* (2013.01); *H01L 23/528* (2013.01); *H01L 23/535* (2013.01)

(58) Field of Classification Search
CPC ..... H01L 29/06; H01L 29/782; H01L 29/786; H01L 29/7725; H01L 29/775; H01L 29/778; H01L 27/0207; H01L 23/528; H01L 23/535; H01L 29/7816; H01L 29/0692; H01L 29/404; H01L 29/7824;
(Continued)

(56) References Cited

U.S. PATENT DOCUMENTS 5,804,864 A    9/1998  Akiyama
5,994,189 A    11/1999 Akiyama
(Continued)

FOREIGN PATENT DOCUMENTS

JP        2009-164460 A    7/2009

OTHER PUBLICATIONS

Son et al. A new SOI LDMOSFET Structure with a Trench in the Drift Region for a PDP Scan Driver IC. ETRI Journal, vol. 26, No. 1, Feb. 2004, pp. 7-11 (Year: 2004).*

*Primary Examiner* — Galina G Yushina
(74) *Attorney, Agent, or Firm* — Posz Law Group, PLC (57) ABSTRACT

A semiconductor device includes a semiconductor substrate, a body layer, a source region, a drift layer, a drain region, a gate insulating film, and a gate electrode. The semiconductor substrate has an active layer. An element region is included in the active layer and partitioned by a trench isolation portion. The body layer is disposed at a surface layer portion of the active layer. The source region is disposed at a surface layer portion of the body layer. The drift layer is disposed at the surface layer portion of the active layer. The drain region is disposed at a surface layer portion of the drift layer. The gate insulating film is disposed on a surface of the body layer. The gate electrode is disposed on the gate insulating film. One of the source region and the drain region being a high potential region is surrounded by the other one being a low potential region.

15 Claims, 9 Drawing Sheets

(58) Field of Classification Search
CPC .............. H01L 29/0653; H01L 29/0878; H01L 29/4238; H01L 29/7835; G06F 30/00
See application file for complete search history.

(56) References Cited

U.S. PATENT DOCUMENTS

| | | | | |
|---|---|---|---|---|
| 6,051,456 | A * | 4/2000 | Davies | H01L 21/8249 438/234 |
| 6,468,870 | B1 * | 10/2002 | Kao | H01L 21/28194 257/E29.256 |
| 2003/0001224 | A1 * | 1/2003 | Itakura | H01L 21/765 257/E21.574 |
| 2004/0140517 | A1 * | 7/2004 | Tsuchiko | H01L 29/0878 257/E29.066 |
| 2006/0049406 | A1 * | 3/2006 | Amaratunga | H01L 29/7824 257/E29.279 |
| 2009/0236665 | A1 * | 9/2009 | Lin | H01L 29/7836 257/E21.409 |
| 2011/0133269 | A1 | 6/2011 | Yamaji | |
| 2013/0341717 | A1 * | 12/2013 | Chen | H01L 29/66659 257/337 |
| 2015/0270333 | A1 * | 9/2015 | Yang | H01L 21/76283 438/151 |
| 2015/0340448 | A1 * | 11/2015 | Babcock | H01L 29/66712 257/340 |
| 2016/0351708 | A1 * | 12/2016 | Kameoka | H01L 29/0878 |
| 2018/0151723 | A1 * | 5/2018 | Grote | H01L 29/66681 |

* cited by examiner

SEMICONDUCTOR DEVICE

CROSS REFERENCE TO RELATED APPLICATIONS

The present application is a continuation application of International Patent Application No. PCT/JP2019/018570 filed on May 9, 2019, which designated the U.S. and claims the benefit of priority from Japanese Patent Application No. 2018-098071 filed on May 22, 2018. The entire disclosures of all of the above applications are incorporated herein by reference.

TECHNICAL FIELD

The present disclosure relates to a semiconductor device forming a laterally diffused metal-oxide semiconductor transistor (hereinafter referred to simply as "LDMOS").

BACKGROUND

A semiconductor device may form an LDMOS. For example, in the semiconductor device, an element region is partitioned by a trench isolation portion. In the semiconductor device, an n-channel type LDMOS may be provided by a source region and a drain region included in the element region. The trench isolation portion may be provided by placement of an insulating film in a groove portion. In the element region, the drain region, the source region, and the like included in the n-channel type LDMOS may be provided, and a p-type buffer layer may be provided between the drain region and the trench isolation portion.

SUMMARY

The present disclosure describes a semiconductor device forming an LDMOS including a semiconductor substrate, a body layer, a source region, a drift layer, a drain region, a gate insulating film, and a gate electrode. The semiconductor substrate has an active layer. An element region is included in the active layer and partitioned by a trench isolation portion. The body layer is disposed at a surface layer portion of the active layer. The source region is disposed at a surface layer portion of the body layer. The drift layer is disposed at the surface layer portion of the active layer. The drain region is disposed at a surface layer portion of the drift layer. One of the source region and the drain region being a high potential region is surrounded by the other one of the source region and the drain region being a low potential region.

BRIEF DESCRIPTION OF DRAWINGS

The present disclosure will become more apparent from the following detailed description made with reference to the accompanying drawings. In the drawings.

DETAILED DESCRIPTION

In a semiconductor device forming an LDMOS, in a situation where a high electric field is applied to the drain region, an electric field concentration may be inhibited from being generated in an insulating film of a trench isolation portion by a buffer layer.

However, in this type of semiconductor device, although the electric field concentration may be inhibited from being generated in the insulating film of the trench isolation portion, it is required to form the buffer layer. Therefore, a manufacturing process may be lengthened. It may be desirable to inhibit the electric field concentration from being generated in the insulating film of the trench isolation portion without forming the buffer layer.

In the above semiconductor device, the array (that is, a positional relationship) of the drain region, the source region, the buffer layer, and the trench isolation portion is defined. In the semiconductor device, in a situation where a current capability is to be increased, an area may be increased only in one direction intersecting with an alignment direction of the drain region, the source region, the buffer layer, and the trench isolation portion. Therefore the layout of the element region tends to be longer along one direction, and the degree of freedom of the layout may be lower.

According to an aspect of the present disclosure, a semiconductor device forms a laterally-diffused metal-oxide semiconductor transistor. The semiconductor device includes a semiconductor substrate, a body layer of a first conductivity type, a source region of a second conductivity type, a drain region of the second conductivity type, a gate insulating film, and a gate electrode. The semiconductor substrate has an active layer. An element region is included in the active layer and partitioned by a trench isolation portion. A main surface of the semiconductor substrate includes a surface of the active layer. The body layer is disposed at a surface layer portion of the active layer located at the element region. The source region is disposed at a surface layer portion of the body layer. The drift layer is disposed at the surface layer portion of the active layer located at the element region. The drain region is disposed at a surface layer portion of the drift layer. The gate insulating film is disposed on a surface of the body layer. The gate electrode is disposed on the gate insulating film. One of the source region and the drain region being a high potential region is surrounded by the other one of the source region and the drain region being a low potential region. The high potential region has a higher potential than the low potential region.

According to the above configuration, since the high potential region is surrounded by the low potential region, the high electric field caused by the high potential region is less likely to reach the trench isolation portion. In other words, even if the buffer layer is not formed in the active layer, the high electric field may be inhibited from reaching the trench isolation portion. Since the high potential region is surrounded by the low potential region, when the current capability is to be increased, it is sufficient to increase the overall element region. Therefore, the element region may be inhibited from becoming extremely long in one direction, and the degree of freedom of layout may be inhibited from decreasing.

The following describes several embodiments of the present disclosure with reference to the drawings. In the following embodiments, parts which are identical or equivalent to each other will be described with the same reference signs.

First Embodiment

The following describes a first embodiment with reference to the drawings. In the present embodiment, a semiconductor device in which a p-channel type LDMOS is formed will be described.

Figure 1:
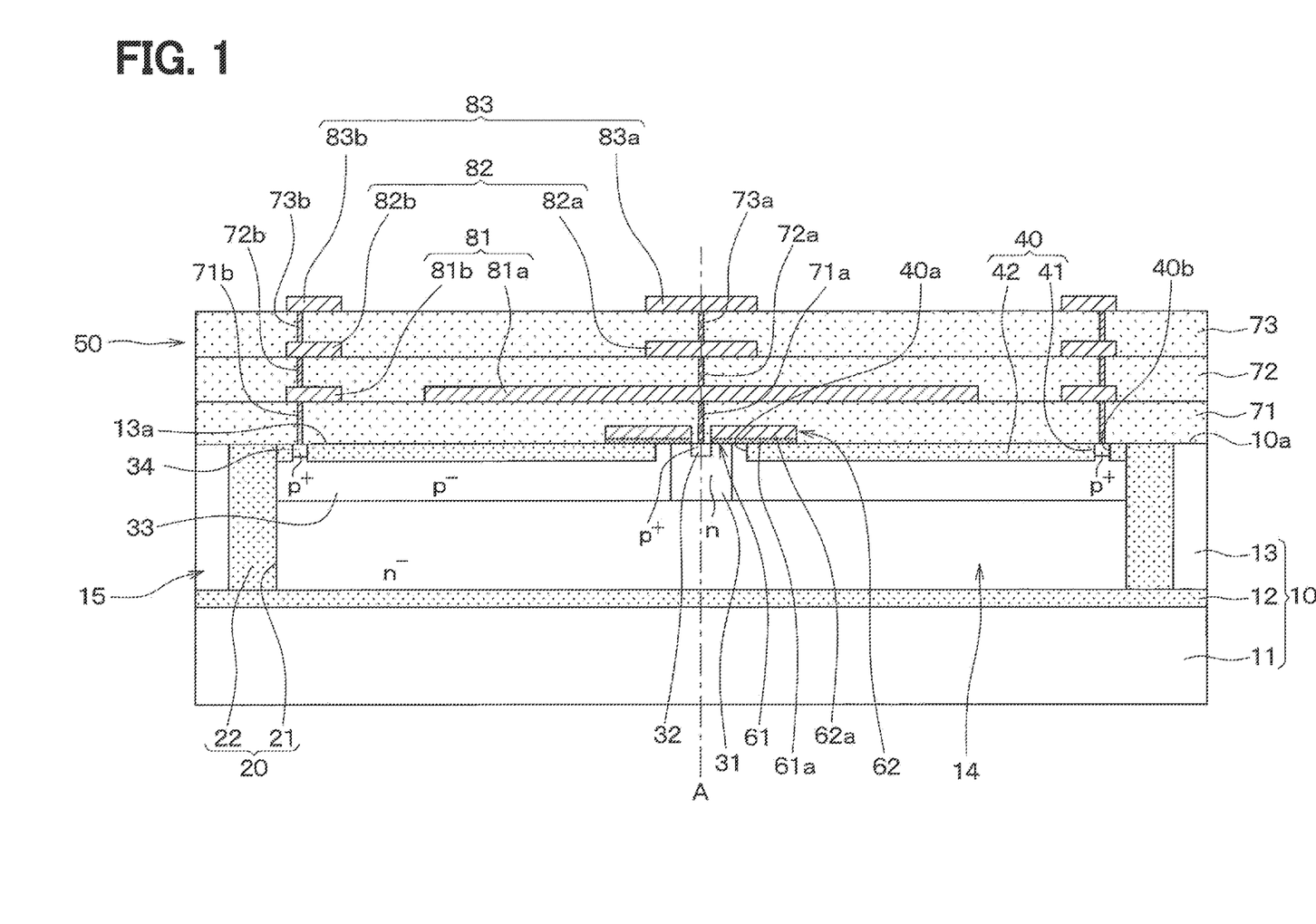
FIG. 1 is a cross-sectional view of a semiconductor device according to a first embodiment.

As shown in FIG. 1, the semiconductor device according to the present embodiment is provided by adoption of an SOI (Silicon On Insulator) substrate 10 in which an active layer 13 is stacked over a support substrate 11 with interposition of a buried insulating film 12. The support substrate 11 is formed of a semiconductor substrate made of silicon or the like, and the buried insulating film 12 is formed of an oxide film or the like. The active layer 13 is formed of an n⁻-type silicon substrate having predetermined impurity concentration. Hereinafter, a surface of the active layer 13 on an opposite side to the buried insulating film 12 side is also referred to as a surface 13a of the active layer 13. A surface of the SOI substrate 10 including the surface 13a of the active layer 13 is also referred to as a main surface 10a of the SOI substrate 10.

The active layer 13 is partitioned into an element region 14 and a field ground region 15 by the trench isolation portion 20. Therefore, the element region 14 and the field ground region 15 are isolated from each other. In the present embodiment, the active layer 13 is isolated by the trench isolation portion 20 so that the element region 14 is surrounded by the field ground region 15.

The trench isolation portion 20 is formed in a groove portion 21 provided so as to reach the buried insulating film 12 from the surface 13a of the active layer 13 so as to bury the insulating film 22 in the groove portion 21. The insulating film 22 is disposed in the groove portion 21 by embedding an insulating material by thermal oxidation or deposition.

In the element region 14, an n-type body layer 31 having an impurity concentration higher than that of the active layer 13 is formed in the central portion of a surface layer portion of the active layer 13. In the surface layer portion of the body layer 31, a p⁺-type source region 32 is formed so as to be exposed from the surface 13a of the active layer 13. The source region 32 is terminated in the body layer 31.

A p⁻ type drift layer 33 is formed on the surface layer portion of the active layer 13 so as to be in contact with the body layer 31 and the trench isolation portion 20. Specifically, the drift layer 33 is formed in a frame shape so as to surround the body layer 31 when viewed from a normal direction to the surface 13a of the active layer 13 (hereinafter, simply, when viewed from the normal direction). The normal direction to the surface 13a of the active layer 13 is, in other words, a normal direction to the main surface 10a of the 501 substrate 10. "Viewed from the direction normal to the surface 13a of the active layer 13", is expressed by, in other words, "in the direction normal to the main surface 10a". In the present embodiment, the drift layer 33 is formed to a depth substantially equal to that of the body layer 31.

In the surface layer portion of the drift layer 33, a p⁺-type drain region 34 having a higher impurity concentration than that of the drift layer 33 is formed so that the drain region 34 is exposed from the surface 13a of the active layer 13. In the present embodiment, the drain region 34 is formed on the trench isolation portion 20 side opposite to the body layer 31 side of the drift layer 33. Like the drift layer 33, the drain region 34 is formed to surround the body layer 31. In other words, the drain region 34 is formed so as to surround the source region 32. In the present embodiment, in an off-state in which a current does not flow between the source and the drain, the source region 32 becomes a high potential region which is higher in potential than the drain region 34. When viewed from the normal direction, the semiconductor device is provided such that the source region 32 serving as a high potential region is surrounded by the drain region 34 serving as a low potential region.

Further, an STI (an abbreviation for Shallow Trench Isolation) isolation portion 40 is formed in the surface layer portion of the active layer 13. The STI isolation portion 40 is formed in such a manner that after a trench 41 having a predetermined depth is provided in the surface layer portion of the active layer 13 and an insulating film 42 is embedded into the trench 41, the embedded insulating film 42 is planarized by a CMP (an abbreviation for Chemical Mechanical Polishing) method or the like.

A first opening 40a and a second opening 40b are provided in the STI isolation portion 40. Specifically, the first opening 40a is provided so as to expose a central portion of the surface 13a of the active layer 13, In the present embodiment, the first opening 40a is provided so as to expose a portion of body layer 31 side among the source region 32, the body layer 31, and the drift layer 33. The second opening 40b is provided so as to expose an outer edge of the surface 13a of the active layer 13. In the present embodiment, the drain region 34 is provided to be exposed. The second opening 40b may be formed in a frame shape along the drain region 34, or may be formed so as to expose one portion or multiple portions of the drain region 34. In the present embodiment, the second opening 40b is provided so as to expose the multiple portions of the drain region 34.

In the present embodiment, the body layer 31, the source region 32, the drift layer 33, and the drain region 34 pass through the center of the active layer 13, and are substantially rotationally symmetrical with respect to an axis A extending along a direction intersecting with the surface 13a and passing through the center of the active layer 13.

A wiring layer 50 is formed on the main surface 10a of the SOI substrate 10. In the present embodiment, the wiring layer 50 is configured to have a lower layer insulating film 61, a lower layer wiring portion 62, first to third interlayer insulating film 71 to 73, and first to third wiring portions 81 to 83. In the present embodiment, the first to third interlayer insulating films 71 to 73 correspond to an upper layer insulating film, and the first to third wiring portions 81 to 83 correspond to an upper layer wiring portion.

The lower layer insulating film 61 is provided to have a gate insulating film 61a extending from a portion of the STI isolation portion 40 on the first opening 40a side to the body layer 31, on the surface 13a of the active layer 13. The lower layer wiring portion 62 is configured to have a gate electrode 62a disposed on the gate insulating film 61a, In the present embodiment, the gate insulating film 61a (that is, the lower layer insulating film 61) is formed of an oxide film or the like, and the gate electrode 62a (that is, the lower layer wiring portion 62) is made of a doped polysilicon or the like.

The first interlayer insulating film 71 is formed on the main surface 10a of the SOI substrate 10 so as to cover the gate insulating film 61a and the gate electrode 62a, and the first wiring portion 81 is formed on the first interlayer insulating film 71. The second interlayer insulating film 72 is formed on the first interlayer insulating film 71 so as to cover the first wiring portion 81, and the second wiring portion 82 is formed on the second interlayer insulating film 72. The third interlayer insulating film 73 is formed on the second interlayer insulating film 72 so as to cover the second wiring portion 82, and the third wiring portion 83 is formed on the third interlayer insulating film 73. The first to third interlayer insulating films 71 to 73 are formed of tetraethoxysilane (tetraethyl orthosilicate) films or the like. The first to third wiring portions 81 to 83 are made of aluminum or the like.

Figure 2:
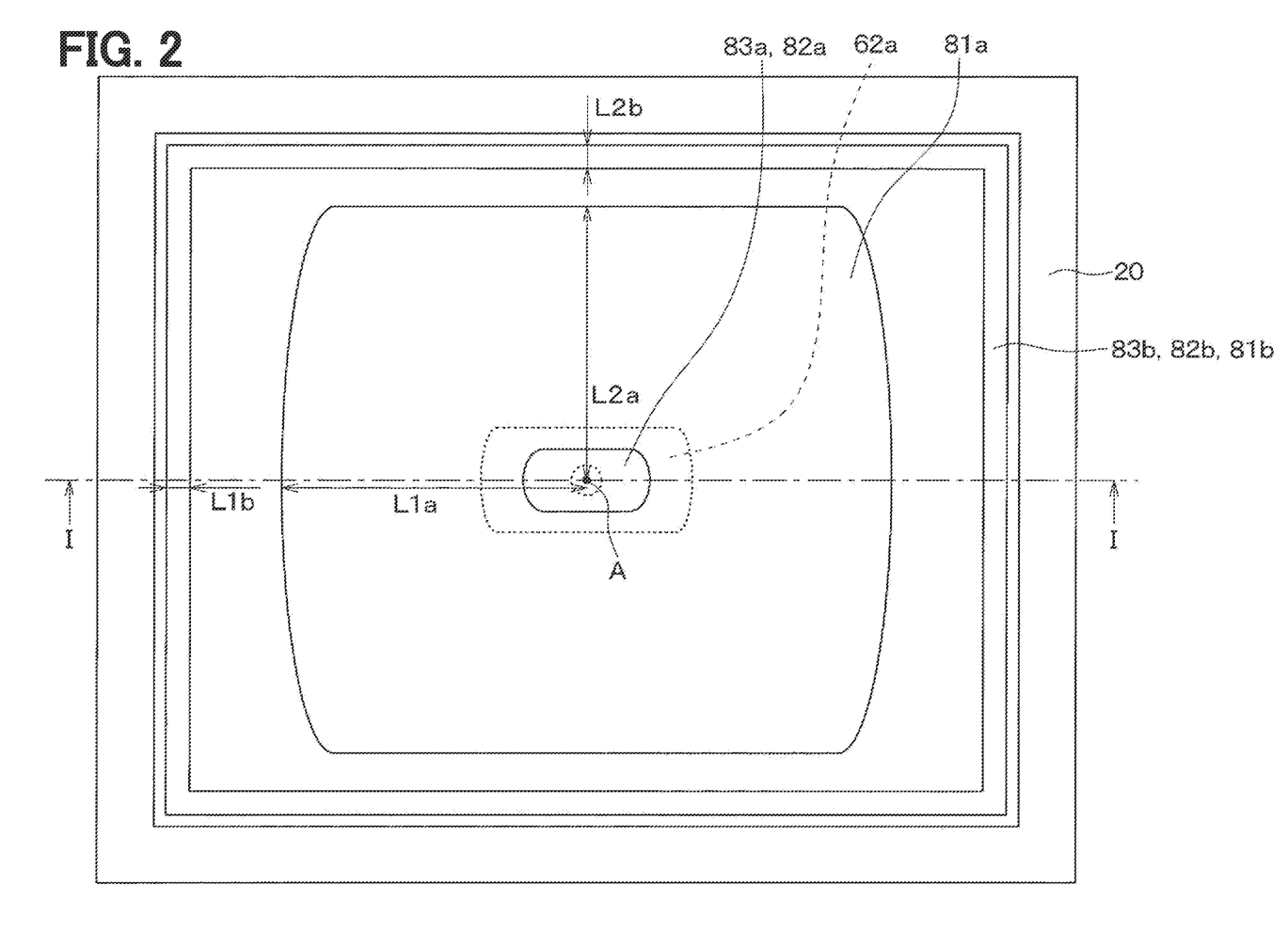
FIG. 2 is a plan view illustrating a positional relationship among a trench isolation portion, a lower layer wiring portion, and first to third wiring portions shown in FIG. 1.

In this example, the configuration of the first to third wiring portions 81 to 83 according to the present embodiment will be specifically described with reference to FIGS. 1 and 2. The trench isolation portion 20, the lower layer wiring portion 62, and the first to third wiring portions 81 to 83 in FIG. 1 correspond to a cross-sectional view taken along a line I-I in FIG. 2.

The first wiring portion 81 includes a first source wiring portion 81a located on the source region 32, and a first drain wiring portion 81b located on the drain region 34. The second wiring portion 82 includes a second source wiring portion 82a located on the source region 32, and a second drain wiring portion 82b located on the drain region 34. The third wiring portion 83 includes a third source wiring portion 83a located on the source region 32, and a third drain wiring portion 83b located on the drain region 34.

The first to third drain wiring portions 81b to 83b are formed in a frame shape along the drain region 34. In other words, when viewed from the normal direction, the first to third source wiring portions 81a to 83a formed on the source region 32 are surrounded by the first to third drain wiring portions 81b to 83b formed on the drain region 34.

The first source wiring portion 81a is electrically connected to the source region 32 through a first source via 71a provided in the first interlayer insulating film 71. The first drain wiring portion 81b is electrically connected to the drain region 34 through a first drain via 71b provided in the first interlayer insulating film 71.

The second source wiring portion 82a is connected to the first source wiring portion 81a through a second source via 72a provided in the second interlayer insulating film 72. The third source wiring portion 83a is connected to the second source wiring portion 82a through a third source via 73a provided in the third interlayer insulating film 73.

The second drain wiring portion 82b is connected to the first drain wiring portion 81b through a second drain via 72b provided in the second interlayer insulating film 72. The third drain wiring portion 83b is connected to the second drain wiring portion 82b through a third drain via 73b provided in the third interlayer insulating film 73.

In the present embodiment, the first to third source wiring portions 81a to 83a correspond to high potential wiring portions, and the first to third drain wiring portions 81b to 83b correspond to low potential wiring portions. Each of the vias 71a, 71b to 73a, and 73b are provided by tungsten embedded in contact holes provided in the interlayer insulating films 71 to 73, respectively.

The first source wiring portion 81a is shaped to protrude on the outer edge side more than the second source wiring portion 82a and the third source wiring portion 83a. When viewed from the normal direction, the first source wiring portion 81a is shaped to protrude toward the trench isolation portion 20 more than the second source wiring portion 82a and the third source wiring portion 83a. When viewed from the normal direction, the second source wiring portion 82a and the third source wiring portion 83 are shaped to be located inside the gate electrode 62a. On the other hand, when viewed from the normal direction, the first source wiring portion 81a is shaped to protrude toward the trench isolation portion 20 more than the gate electrode 62a. Therefore, a distance between the first source wiring portion 81a and the first drain wiring portion 81b is narrower than a distance between the second source wiring portion 82a and the second drain wiring portion 82b, and a distance between the third source wiring portion 83a and the third drain wiring portion 83b.

The first source wiring portion 81a is longer than the first to third drain wiring portions 81b to 83b in a length along one direction of the main surface 10a from a portion intersecting with the axis A. For example, in the first source wiring portion 81a, a length along a left-right direction of the drawing in FIG. 2 is defined as a first source length L1a, and a length along a vertical direction of the drawing in FIG. 2 is defined as a second source length L2a. In the first drain wiring portion 81b, a length along the left-right direction of the drawing in FIG. 2 is defined as a first drain length L1b, and a length along the vertical direction of the drawing in FIG. 2 is defined as a second drain length L2b. In that situation, the first source length L1a of the first source wiring portion 81a is longer than the first drain length L1b of the first drain wiring portion 81b. The second source length L2a of the first source wiring portion 81a is longer than the second drain length L2b of the first drain wiring portion 81b.

The first source length L1a and the second source length L2a are equal to each other, and the first drain length L1b and the second drain length L2b are equal to each other. In addition, the first to third wiring portions 81 to 83 also have connection wiring portions or the like which are connected to other regions in a cross section different from that of FIG. 1. However, connection wiring portions and the like are not placed between the respective source wiring portions 81a to 83a and the drain wiring portions 81b to 83b. In particular, a connection wiring portion or the like is not placed between the first source wiring portion 81a and the first drain wiring portion 81b.

The configuration of the semiconductor device according to the present embodiment has been described above. The n-type corresponds to a first conductivity type, and the p-type corresponds to a second conductivity type. The following describes the operation of the above semiconductor device.

In the above semiconductor device, when a negative voltage is applied to the gate electrode 62a, an inversion layer is formed by holes attracted in the body layer 31 located on a side opposite to the gate electrode 62a across the gate insulating film 61a. This results in an on-state in which a current flows between a source and a drain.

When the application of a voltage to the gate electrode 62a is stopped, the inversion layer disappears and the on state is changed to an off-state in which no current flows between the source and drain, and a potential of the source region 32 is higher than the drain region 34. For example, a voltage between the source and the drain is 150 V. At this time, in the present embodiment, the source region 32 serving as a high potential region is surrounded by the drain region 34 serving as a low potential region. Therefore, a high electric field due to the source region 32 is difficult to reach the trench isolation portion 20.

In the above-described semiconductor device, a portion facing the insulating film 42 in the STI isolation portion 40, which has the same potential as that of the source region 32 or the drain region 34 in the off-state among the wiring portions 62, and 81 to 83 functions as a field plate. The gate electrode 62a, a portion of the first source wiring portion 81a protruding from the gate electrode 62a, and the first drain wiring portion 81b function as the field plate. As compared with a case in which the first source wiring portion 81a does not protrude more than the gate electrode 62a, a region functioning as the field plate is increased, and an electric field concentration is inhibited from being generated between the source and the drain. In other words, the wiring layer 50 according to the present embodiment exhibits a function connected to each region, and also exhibits a function of defining a withstand voltage of the semiconductor device. The portion of the first source wiring portion 81a protruding from the gate electrode 62a is a portion protruding from the gate electrode 62a when viewed from the normal direction.

A p-channel type LDMOS is formed, and the source region 32 serving as a high potential region is surrounded by the drain region 34 serving as a low potential region. Therefore, a high electric field due to the source region 32 is difficult to reach the trench isolation portion 20. In other words, according to the present embodiment, even if the buffer layer is not formed in the active layer 13, the high electric field can be inhibited from reaching the trench isolation portion 20.

Since the source region 32 is surrounded by the drain region 34 to inhibit the high electric field from reaching the trench isolation portion 20, when a current capability increases, the element region 14 may be entirely increased. In other words, when the current capability is increased, the element region 14 may be increased in two or more different directions. When the current capability is increased, the element region 14 can be prevented from becoming extremely large in one direction, and the degree of freedom of layout can be inhibited from decreasing.

In the above-described semiconductor device, a portion facing the insulating film 42 in the STI isolation portion 40, which has the same potential as that of the source region 32 or the drain region 34 in the off-state among the wiring portions 62, and 81 to 83 functions as a field plate. More specifically, the gate electrode 62a, a portion of the first source wiring portion 81a protruding from the gate electrode 62a, and the first drain wiring portion 81b function as the field plate. As compared with a situation in which the first source wiring portion 81a does not protrude more than the gate electrode 62a, a region functioning as the field plate is increased, and an electric field concentration is inhibited from being generated between the source and the drain.

Another connection wiring portion is not placed between the first source wiring portion 81a and the first drain wiring portion 81b functioning as the field plates. The withstand voltage of the semiconductor device can be defined by the shape of the first source wiring portion 81a and the first drain wiring portion 81b. As compared with the situation in which the connection wiring portion is placed between the first source wiring portion 81a and the first drain wiring portion 81b, a withstand voltage design can be facilitated.

Further, the first source wiring portion 81a which is connected to the source region 32 serving as a high potential region is configured to protrude toward the trench isolation portion 20. The first and second source lengths L1a and L2a of the first source wiring portion 81a are set to be longer than the first and second drain lengths L1b and L2b of the first drain wiring portion 81b. For example, as compared with the situation in which the first drain wiring portion 81b is protruded toward the first source wiring portion 81a so that the entire region functioning as a field plate is the same, an electric field close to the source region 32 which is a high electric field region can be easily relaxed.

Second Embodiment

The following describes a second embodiment. In the present embodiment, a lead wiring layer 90 is disposed above a wiring layer 50 as compared with the first embodiment. Other components are the same as those of the first embodiment, and therefore a description of those components will be omitted.

Figure 3:
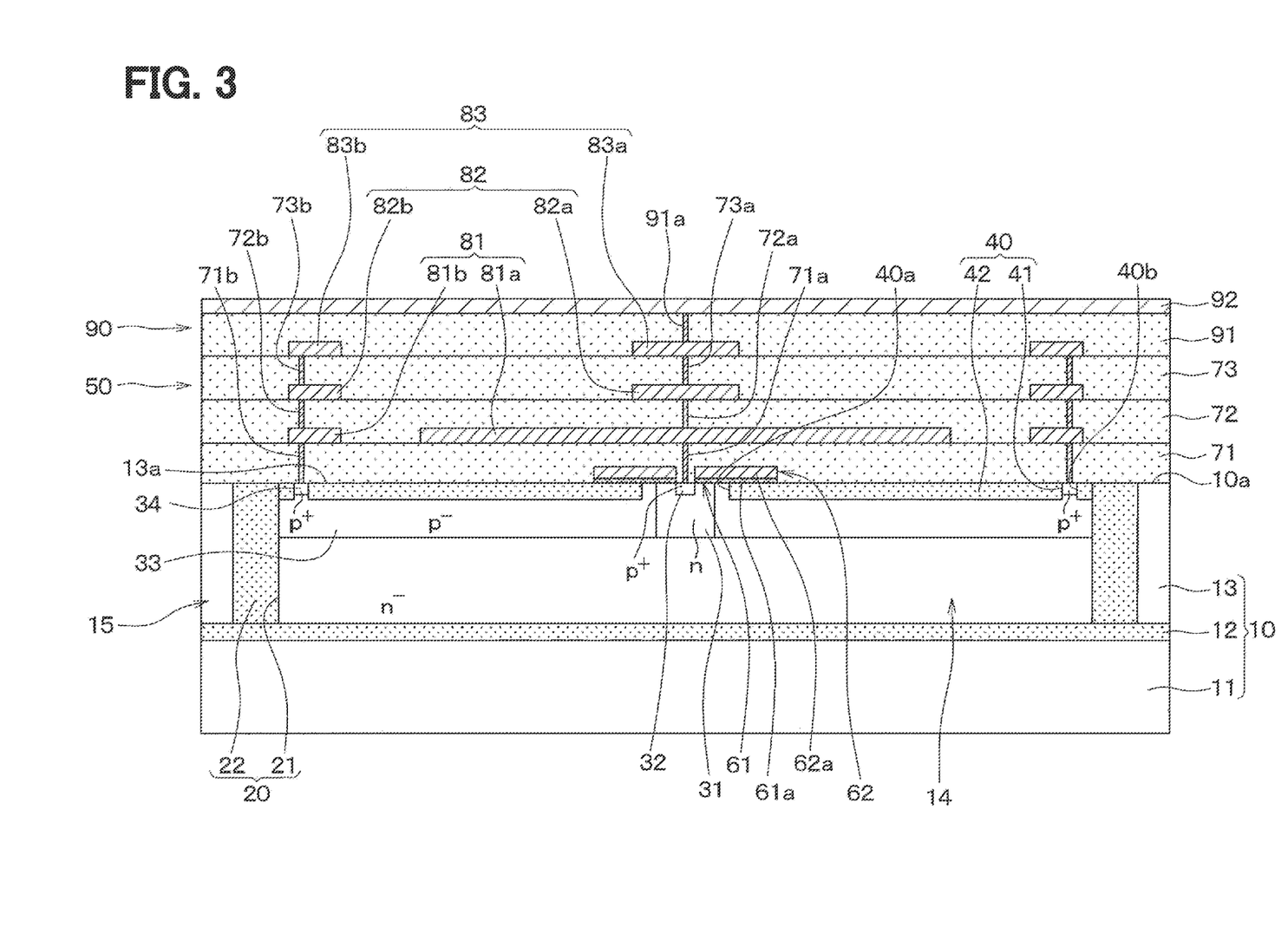
FIG. 3 is a cross-sectional view of a semiconductor device according to a second embodiment.

As shown in FIG. 3, the wiring layer 90 is placed on the wiring layer 50. The lead wiring layer 90 includes a surface layer insulating film 91 that is disposed on a third interlayer insulating film 73 and formed so as to cover the third wiring portion 83, and a lead wiring portion 92 disposed on the surface layer insulating film 91. As with first to third interlayer insulating films 71 to 73, the surface layer insulating film 91 is made of tetraethoxysilane. The lead wiring portion 92 is made of aluminum in the same manner as that of first to third wiring portions 81 to 83.

The lead wiring portion 92 is formed so as to have a portion that overlaps with at least one wiring portion of the first to third wiring portions 81 to 83 when viewed from a normal direction. Specifically, when viewed from the normal direction, the lead wiring portion 92 is formed so as to overlap with a portion that functions as a field plate. The lead wiring portion 92 is formed so as to have a portion overlapping with a first source wiring portion 81a and a first drain wiring portion 81b functioning as a field plate. The lead wiring portion 92 is connected to a third source wiring portion 83a through a via 91a provided in the surface layer insulating film 91. The via 91a is provided by tungsten embedded in a contact hole provided in the surface layer insulating film 91.

In the semiconductor device, the lead wiring layer 90 can be disposed on a wiring layer 50. When viewed from the normal direction, the lead wiring portion 92 is formed so as to overlap with a portion that functions as a field plate. For that reason, since the portion of the lead wiring portion 92 which overlaps with the portion functioning as a field plate does not change a withstand voltage according to a lead method, a layout can be freely changed. Therefore, the versatility can be improved.

An example in which the lead wiring portion 92 is connected to the source region 32 has been described above. Alternatively, the lead wiring portion 92 may be connected to the drain region 34, or may be connected to a region that may have a further high potential than that of the source region 32. In other words, if the lead wiring portion 92 is formed so as to overlap with the portion functioning as a field plate, a portion to be connected can be appropriately changed.

Third Embodiment

The following describes a third embodiment. In the present embodiment, the shape of first to third source wiring portions 81a to 83a is changed as compared with the first embodiment. Other components are the same as those of the first embodiment, and therefore a description of those components will be omitted.

Figure 4:
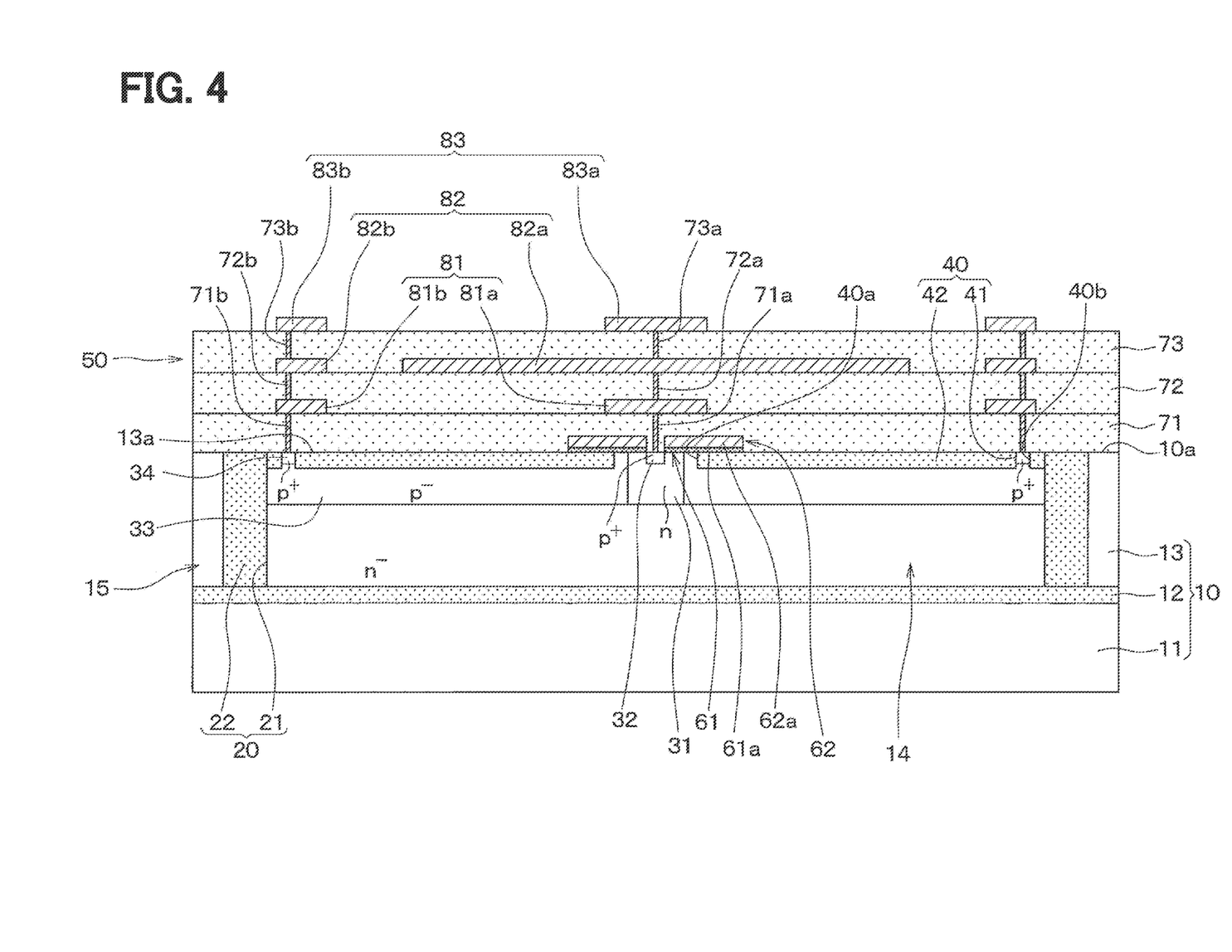
FIG. 4 is a cross-sectional view of a semiconductor device according to a third embodiment.

As shown in FIG. 4, a second source wiring portion 82a is shaped to protrude toward an outer edge more than a first source wiring portion 81a and a third source wiring portion 83a, Specifically, when viewed from the normal direction, the second source wiring portion 82a is shaped to protrude toward a trench isolation portion 20 more than the first and third source wiring portions 81a and 83a.

The first source wiring portion 81a has the same size as that of the third source wiring portion 83a. Further, in the semiconductor device described above, a gate electrode 62a, a portion of the second source wiring portion 82a protruding from the gate electrode 62a, and a first drain wiring portion 81b function as a field plate.

Even if the gate electrode 62a, the second source wiring portion 82a, and the first drain wiring portion 81b function as a field plate, the same effects as those in the first embodiment can be obtained.

A part of the second source wiring portion 82a also functions as a field plate. In that situation, a distance between the second source wiring portion 82a and an STI isolation portion 40 functioning as field plates is wider than a distance between the first source wiring portion 81a and the STI isolation unit 40 when the first source wiring portion 81a functions as a field plate. An electric field intensity between the second source wiring portion 82a and the STI isolation portion 40 functioning as field plates is lower than an electric field strength between the first source wiring portion 81a and the STI isolation portion 40 when the first source wiring portion 81a functions as a field plate. Therefore, as compared with the situation in which only the first source wiring portion 81a functions as a field plate, the first and second interlayer insulating films 71 and 72 located between the second source wiring portion 82a and the STI isolation portion 40 functioning as field plates can be inhibited from being deteriorated. As a result, a breakdown life of the first and second interlayer insulating films 71 and 72 can be lengthened.

Fourth Embodiment

The following describes a fourth embodiment. In the present embodiment, a first source wiring portion 81a is separated as compared with the first embodiment. Other components are the same as those of the first embodiment, and therefore a description of those components will be omitted.

Figure 5:
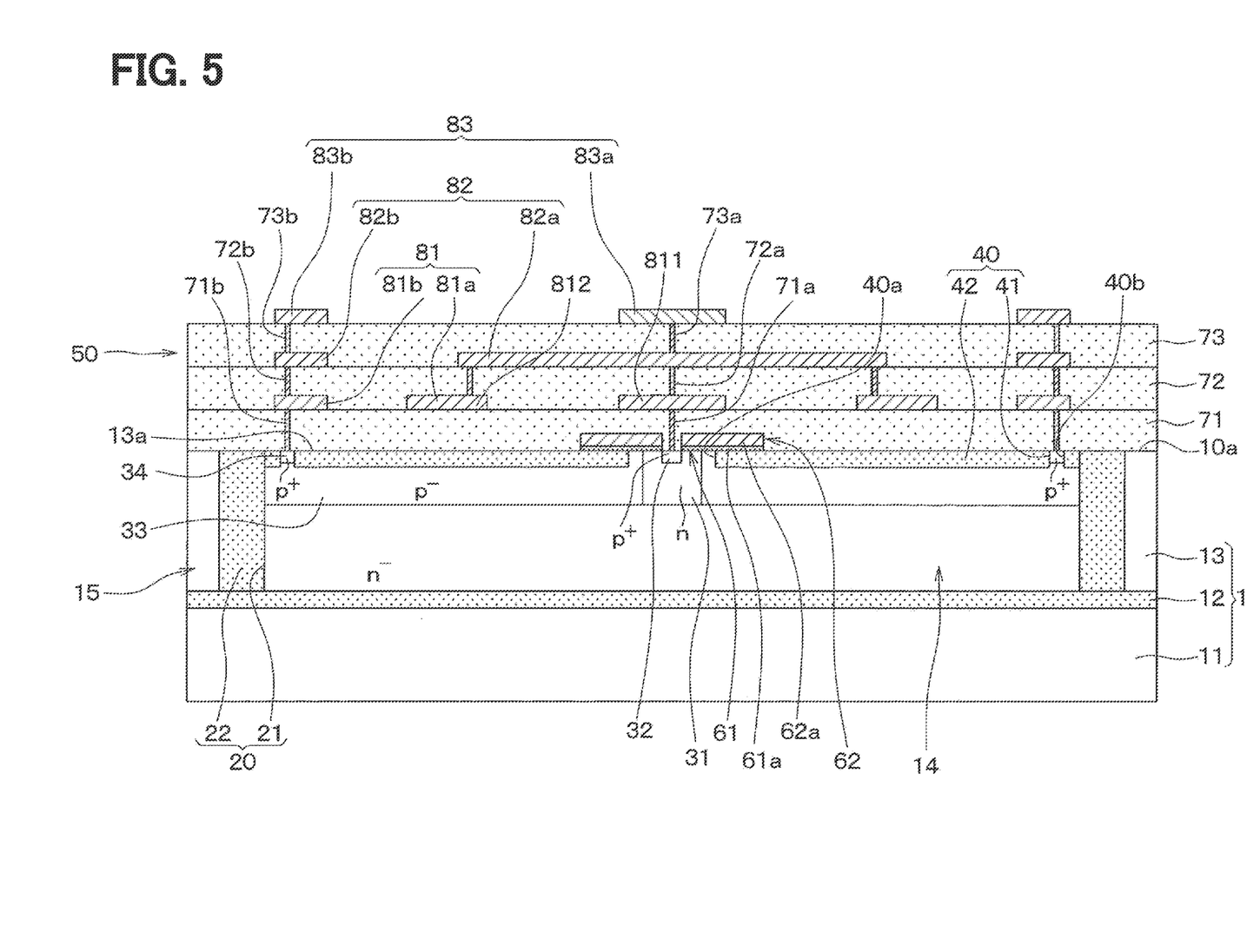
FIG. 5 is a cross-sectional view of a semiconductor device according to a fourth embodiment.

As shown in FIG. 5, the first source wiring portion 81a is separated into an inner edge wiring portion 811 and an outer edge wiring portion 812. The inner edge wiring portion 811 has the same size as that of the third source wiring portion 83a, The outer edge wiring portion 812 is formed in a frame shape surrounding the inner edge wiring portion 811. The second source wiring portion 82a is formed in a size having a portion facing the inner edge wiring portion 811 and the outer edge wiring portion 812.

The inner edge wiring portion 811 and the outer edge wiring portion 812 are electrically connected to each other through a second source wiring portion 82a and a second source via 72a, respectively. As a result, the inner edge wiring portion 811 and the outer edge wiring portion 812 are electrically connected to each other.

In the above semiconductor device, the gate electrode 62a, and the outer edge wiring portion 812 of the first source wiring portion 81a function as a field plate. In the semiconductor device, when viewed from the normal direction, a portion of the second source wiring portion 82a protruding from the gate electrode 62a, which is a portion located between the inner edge wiring portion 811 and the outer edge wiring portion 812 functions as a field plate.

Even when the first source wiring portion 81a is separated and the first source wiring portion 81a and the second source wiring portion 82a function as a field plate, the same effects as those of the first embodiment can be obtained. Since the second source wiring portion 82a also functions as a field plate, the same effects as those of the third embodiment can be obtained.

Fifth Embodiment

A fifth embodiment will be described. In the present embodiment, first to third source wiring portions 81a to 83a protrude in order as compared with the first embodiment. Other components are the same as those of the first embodiment, and therefore a description of those components will be omitted.

Figure 6:
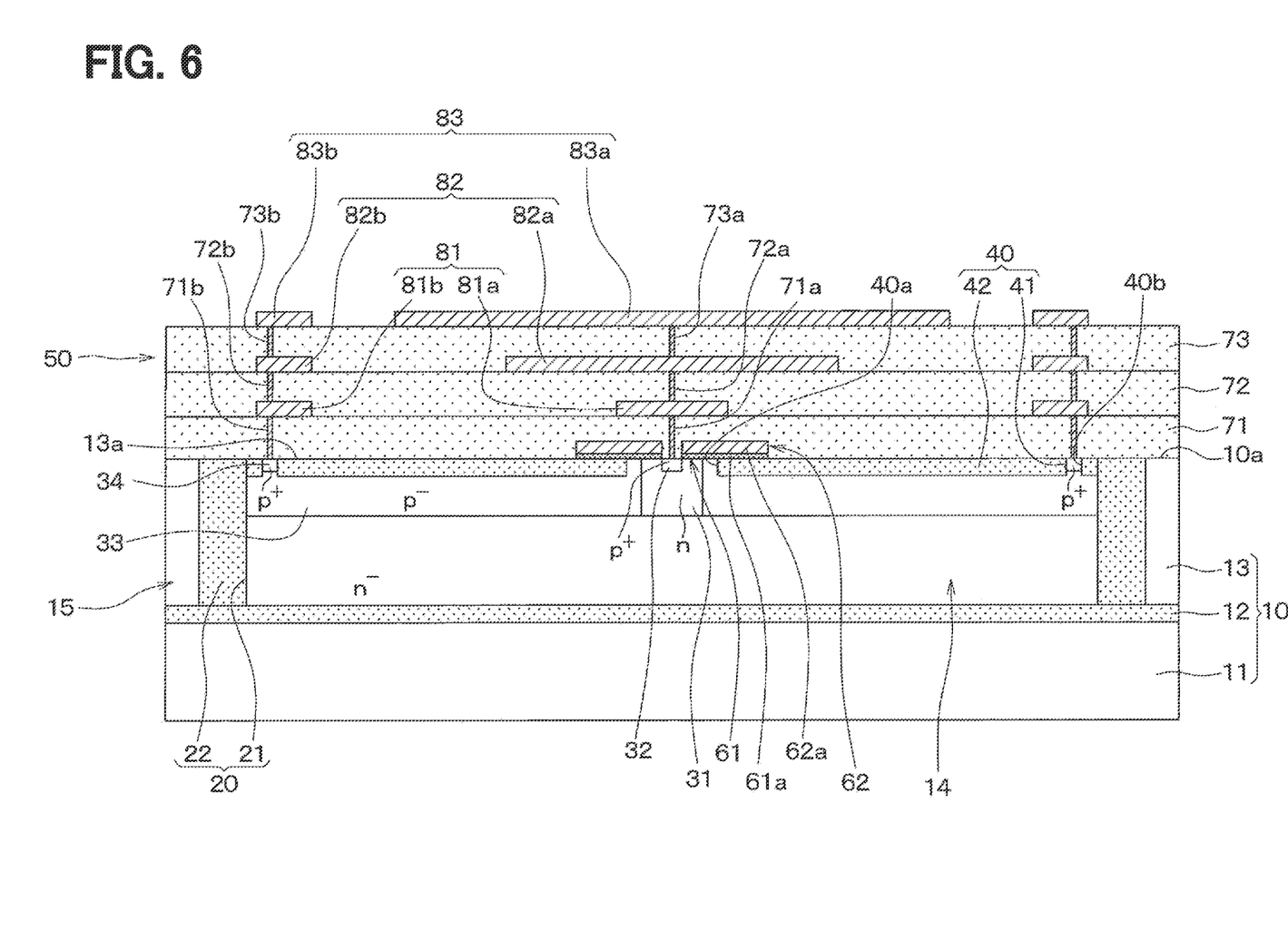
FIG. 6 is a cross-sectional view of a semiconductor device according to a fifth embodiment.

In the present embodiment, as shown in FIG. 6, the first to third source wiring portions 81a to 83a are shaped to protrude toward an outer edge in the order of the third source wiring portion 83a, the second source wiring portion 82a, and the first source wiring portion 81a. Specifically, when viewed from the normal direction, the first to third source wiring portions 81a to 83a are shaped to protrude toward the trench isolation portion 20 in the order of the third source wiring portion 83a, the second source wiring portion 82a, and the first source wiring portion 81a. When viewed from the normal direction, the first source wiring portion 81a is shaped to be located inside a gate electrode 62a.

In the above semiconductor device, the gate electrode 62a, and a portion of the second source wiring portion 82a protruding than the first source wiring portion 81a of the second source wiring portion 82a function as field plates. Further, in the above semiconductor device, a portion of the third source wiring portion 83a protruding more than the second source wiring portion 82a functions as a field plate.

Even when each of the gate electrode 62a and the second and third source wiring portions 82a and 83a function as a field plate, the same effects as those in the first embodiment can be obtained.

Sixth Embodiment

The following describes a sixth embodiment. The present embodiment changes a shape of a first drain wiring portion 81b as compared with the first embodiment. Other components are the same as those of the first embodiment, and therefore a description of those components will be omitted.

Figure 7:
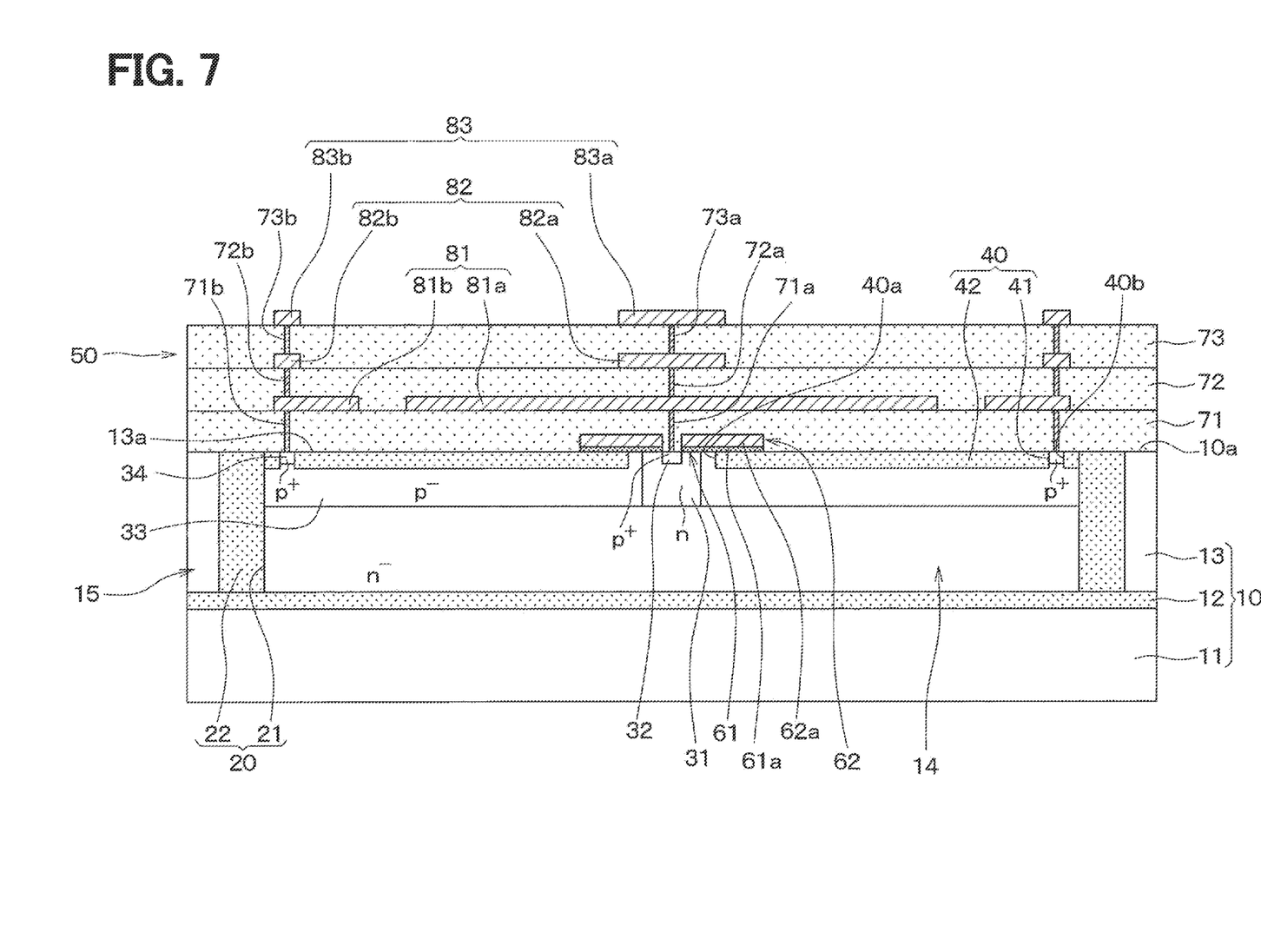
FIG. 7 is a cross-sectional view of a semiconductor device according to a sixth embodiment.

As shown in FIG. 7, the first drain wiring portion 81b is shaped to protrude toward an inner edge more than second and third drain wiring portions 82b and 83b. Specifically, when viewed from the normal direction, the first drain wiring portion 81b is shaped to protrude toward a first source wiring portion 81a more than the second and third drain wiring portions 82b and 83b.

The first drain wiring portion 81b is shaped to protrude. The region functioning as a field plate can be further increased, and an electric field concentration can be inhibited from occurring.

Seventh Embodiment

The following describes a seventh embodiment. In the present embodiment, an n-channel type LDMOS is formed as compared with the first embodiment. Other components are the same as those of the first embodiment, and therefore a description of those components will be omitted.

The semiconductor device according to the present embodiment will be described with reference to FIGS. 8 and 9. A trench isolation portion 20, a lower layer wiring portion 62, and first to third wiring portions 81 to 83 in FIG. 8 correspond to a cross-sectional view taken along a line VIII-VIII in FIG. 9.

Figure 8:
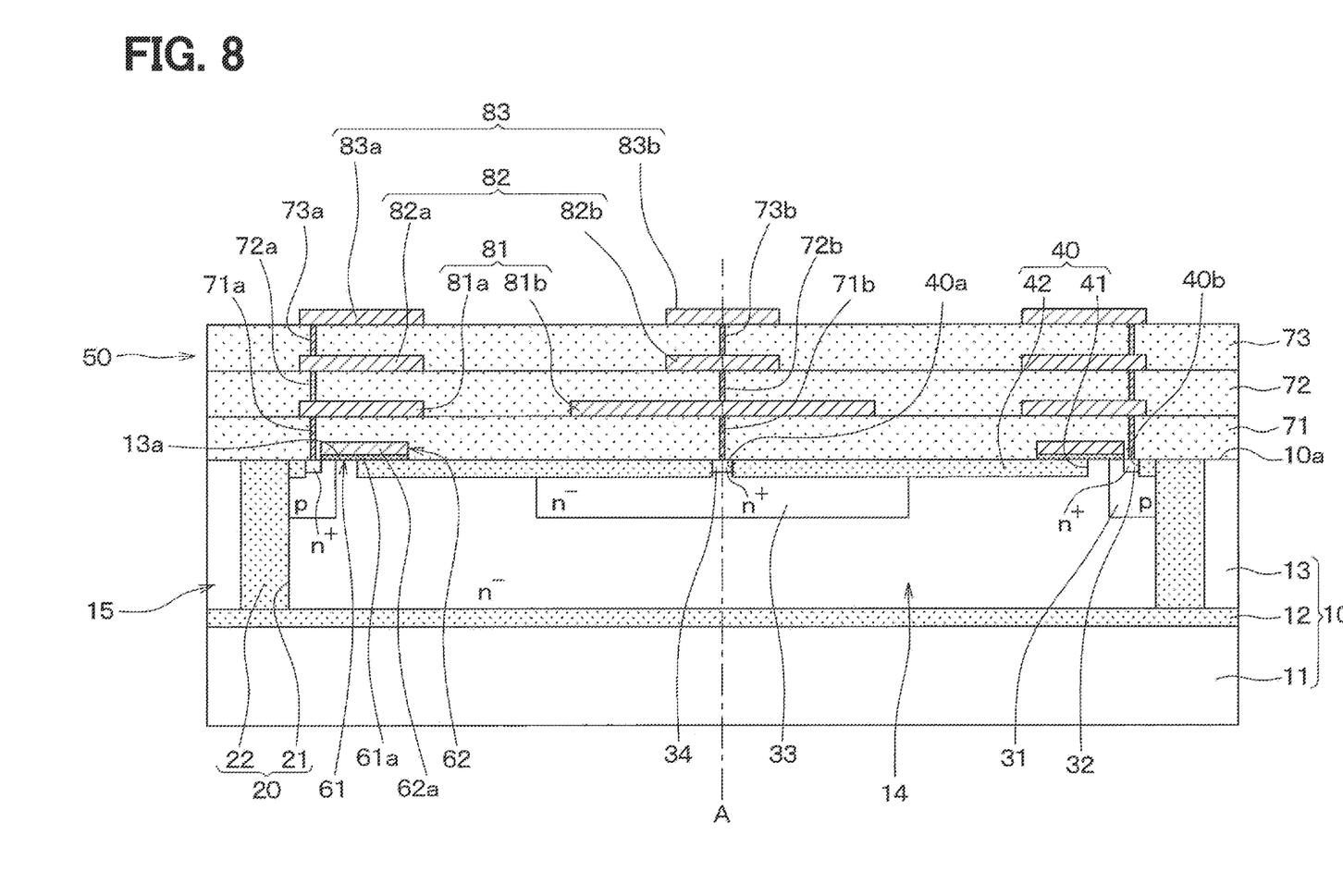
FIG. 8 is a cross-sectional view of a semiconductor device according to a seventh embodiment.
Figure 9:
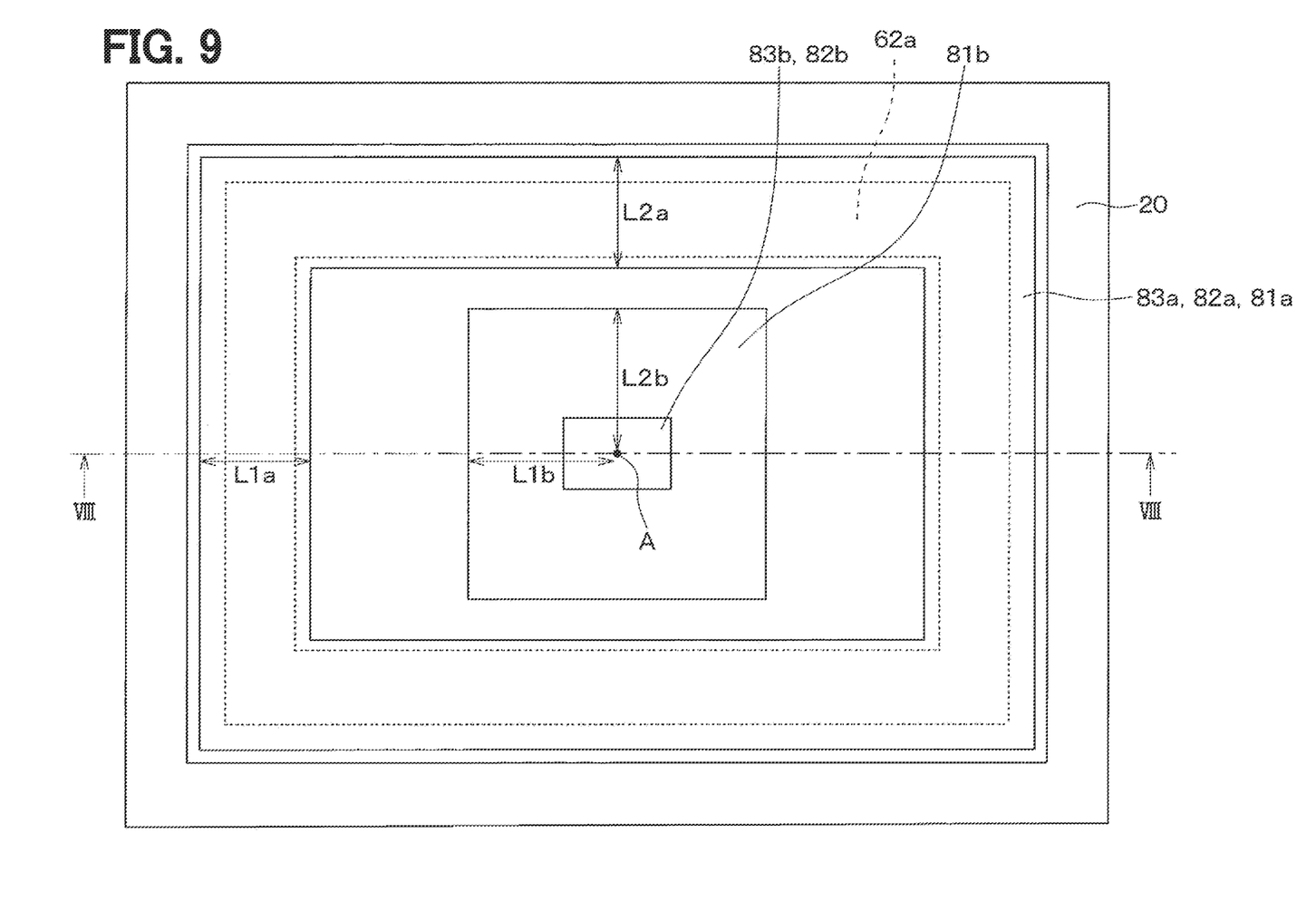
FIG. 9 is a plan view illustrating a positional relationship among a trench isolation portion, a lower layer wiring portion, and first to third wiring portions shown in FIG. 8.

As shown in FIGS. 8 and 9, an n-channel type LDMOS is formed. Specifically, a drift layer 33 is an n$^-$-type and is formed in a center portion or a central portion of a surface layer portion of an active layer 13. A drain region 34 is an n$^+$-type, and formed in a surface layer portion of the drift layer 33 so as to be exposed from a surface 13a of the active layer 13.

The body layer 31 is a p-type, and is formed at a position away from the drift layer 33 in the surface layer portion of the active layer 13. Specifically, the body layer 31 is formed in a frame shape so as to be in contact with a trench isolation portion 20. In other words, the body layer 31 is formed so as to surround the drift layer 33 when viewed from the normal direction. The source region 32 is an n$^+$-type, and formed in a surface layer portion of the body layer 31 so as to be exposed from the surface 13a of the active layer 13. The source region 32 is formed in a frame shape so as to surround the drain region 34 when viewed from the normal direction.

In other words, a positional relationship of the source region 32 and the body layer 31, and a positional relationship of the drain region 34 and the drift layer 33 is opposite to each other as compared with the first embodiment.

The STI isolation portion 40 is formed so that the drain region 34 is exposed from a first opening 40a, and the source region 32, the body layer 31, and the active layer 13 are exposed from a second opening 40b.

As in the above first embodiment, the wiring layer 50 is configured to have a lower layer insulating film 61, a lower layer wiring portion 62, first to third interlayer insulating film 71 to 73, and first to third wiring portions 81 to 83.

A gate insulating film 61a extends from a portion of the STI isolation portion 40 on the body layer 31 side to the body layer 31, and the gate electrode 62a is formed on the gate insulating film 61a.

Further, in the present embodiment, the drain region 34 is formed in the center portion or the central portion of the active layer 13, and the source region 32 is formed in a frame shape so as to surround the drain region 34. The first to third source wiring portions 81a to 83 are formed in a frame shape so as to surround the first to third drain wiring portions 81b to 83b.

Since the drain region 34 is a high potential region in an off-state, the first drain wiring portion 81b is protruded more than the second and third drain wiring portions 82b and 83b. In other words, when viewed from the normal direction, the first drain wiring portion 81b is shaped to protrude toward the trench isolation portion 20 more than the second source wiring portion 82a and the third source wiring portion 83a. The first to third drain wiring portions 81b to 83b correspond to high potential wiring portions, and the first to third source wiring portions 81a to 83a correspond to low potential wiring portions.

The first drain wiring portion 81b is longer than the first to third source wiring portions 81a to 83a in a length along one direction of the main surface 10a from a portion intersecting with the axis A. Specifically, a first drain length L1b of the first drain wiring portion 81b is longer than a first source length L1a of the first source wiring portion 81a. A second drain length L2b of the first drain wiring portion 81b is set to be longer than a second source length L2a of the first source wiring portion 81a. The first drain length L1b and the second drain length L1b are equal to each other, and the first source length L1a and the second source length L1b are equal to each other.

When viewed from the normal direction, the first to third source wiring portions 81a to 83a are shaped to protrude toward the first to third drain wiring portions 81b to 83b more than the gate electrode 62a.

The configuration of the semiconductor device according to the present embodiment has been described above. The p-type corresponds to a first conductivity type, and the n-type corresponds to a second conductivity type. The following describes the operation of the above semiconductor device.

In the semiconductor device according to the present embodiment, when a positive voltage is applied to the gate electrode 62a, an inversion layer is formed by electrons attracted in the active layer 13 and the body layer 31 located on a side opposite to the gate electrode 62a across the gate insulating film 61a. This results in an on-state in which a current flows between a source and a drain.

When the application of a voltage to the gate electrode 62a is stopped, the inversion layer disappears and the on-state is changed to an off-state in which no current flows between the source and the drain, and a potential of the drain region 34 is higher than the source region 32. At this time, the drain region 34 serving as a high potential region is surrounded by the source region 32 serving as a low potential region. The high electric field due to the drain region 34 is difficult to reach the trench isolation portion 20.

As described above, even in a semiconductor device in which the n-channel type LDMOS is formed, since the drain region 34 serving as a high electric field region is surrounded by the source region 32, the high electric field can be inhibited from reaching the trench isolation portion 20.

In the above semiconductor device, the first drain wiring portion 81b is shaped to protrude more than the second and third drain wiring portions 82b and 83b. In the above semiconductor device, the gate electrode 62a, the first drain wiring portion 81b, and a portion of the first source wiring portion 81a protruding from the gate electrode 62a function as field plates. As compared with a situation in which the first drain wiring portion 81b has the same size as that of the second and third drain wiring portions 82b and 83b, a region functioning as the field plate is increased, and an electric field concentration is inhibited from being generated between the source and the drain.

OTHER EMBODIMENTS

Although the present disclosure has been described in accordance with the embodiments, it is understood that the present disclosure is not limited to such embodiments or structures. The present disclosure encompasses various modifications and variations within the scope of equivalents. In addition, various combinations and configurations, as veil as other combinations and configurations that include only one element, more, or less, are within the scope and spirit of the present disclosure.

For example, in each of the embodiments described above, the wiring layer 50 may have only the first wiring portion 81 rather than having the first to third wiring portions 81 to 83, or may have only the first wiring portion 81 and the second wiring portion 82. Further, the wiring layer 50 may include another wiring portion in addition to the first to third wiring portions 81 to 83.

In the first embodiment described above, the first to third source wiring portions 81a to 83a may not be a shape protruding to the outer edge side. Even in the semiconductor device described above, since the source region 32 serving as a high electric field region is surrounded by the drain region 34 serving as a low potential region, the high electric field can be inhibited from reaching the trench isolation portion 20. In the same manner, in the second to sixth embodiments described above, the first to third source wiring portions 81a to 83a may not be a shape protruding to the outer edge side. Further, in the seventh embodiment, the first drain wiring portion 81b may not be a shape protruding on the outer edge side.

In the third embodiment, the third source wiring portion 83a may be shaped to protrude toward the trench isolation portion 20 side as compared with the first and second source wiring portions 81a and 82a. In other words, if the region functioning as the field plate increases, the protruding portion among the first to third source wiring portions 81a to 83a can be appropriately changed. In that situation, it may be possible to appropriately change the location and size of the protruding portion in consideration of the impurity concentration of the source region 32 and the drain region 34 formed in the active layer 13. Further, the first to third source wiring portions 81a to 83a may have the same size if the first to third source wiring portions 81a to 83a are shaped to protrude from the gate electrode 62a.

In the fourth embodiment, the first source wiring portion 81a may be separated into other wiring portions in addition to the inner edge wiring portion 811 and the outer edge wiring portion 812.

In the seventh embodiment, the first to third drain wiring portions 81b to 83b may not be shaped to protrude toward the first to third source wiring portions 81a to 83a as compared with the gate electrode 62a when viewed from the normal direction. In the situation of the semiconductor device described above, the first source wiring portion 81a and the gate electrode 62a functions as field plates.

The embodiments described above may also be combined with each other. For example, the n-channel semiconductor device according to the seventh embodiment can combine the configurations of the second to seventh embodiments together. In addition, the second embodiment may be combined with the third to sixth embodiments to have the lead wiring layer 90. The sixth embodiment may be combined with the second to seventh embodiments so that the first to third source wiring portions 81a to 83a and the first to third drain wiring portions 81b to 83b protrude, respectively. Further, combinations of the above embodiments may be appropriately combined together.

What is claimed is:

1. A semiconductor device forming a laterally-diffused metal-oxide semiconductor transistor, comprising:
    a semiconductor substrate having an active layer, an element region being included in the active layer and partitioned by a trench isolation portion, a main surface of the semiconductor substrate including a surface of the active layer;
    a body layer of a first conductivity type disposed at a surface layer portion of the active layer located at the element region;
    a source region of a second conductivity type disposed at a surface layer portion of the body layer;
    a drift layer of the second conductivity type disposed at the surface layer portion of the active layer located at the element region;
    a drain region of the second conductivity type disposed at a surface layer portion of the drift layer;
    a gate insulating film disposed on a surface of the body layer; and
    a gate electrode disposed on the gate insulating film, wherein:
    one of the source region and the drain region being a high potential region is surrounded by the other one of the source region and the drain region being a low potential region, the high potential region having a higher potential than the low potential region;
    the drift layer is disposed to be in contact with the trench isolation portion;
    a depth of the drift layer from the main surface is identical to a depth of the body layer from the main surface in a direction normal to the main surface;
    the drain region and the body layer are rotationally symmetrical with respect to an axis extending along a direction intersecting the surface of the active layer and passing through a center of the active layer;
    the axis intersects a surface of the body layer; and
    the drain region surrounds the body layer.

2. The semiconductor device according to claim 1, further comprising:
    a wiring layer disposed on the semiconductor substrate, the wiring layer having a lower layer insulating film, a lower layer wiring portion, an upper layer insulating film and an upper layer wiring portion, wherein:
    the gate insulating film is included in the lower layer insulation film;
    the gate electrode is included in the lower layer wiring portion;
    the upper layer wiring portion includes
        a source wiring portion disposed on the source region, and
        a drain wiring portion disposed on the drain region;
    one of the drain wiring portion and the source wiring portion which is connected to the high potential region is configured as a high potential wiring portion, and the other one of the drain wiring portion and the source wiring portion which is connected to the low potential region is configured as a low potential wiring portion;
    the low potential wiring portion surrounds the high potential wiring portion in a normal direction to the main surface;
    the high potential wiring portion and the low potential wiring portion respectively have lengths in a direction from an axis along one direction of the main surface, the axis passing through the high potential region and extending in a direction intersecting with the main surface; and
    the length of the high potential wiring portion is longer than the length of the low potential wiring portion.

3. The semiconductor device according to claim 2, further comprising:
    a lead wiring layer that includes a lead wiring portion having a portion overlapping with the upper layer wiring portion in the normal direction, and is disposed on the wiring layer.

4. The semiconductor device according to claim 2, wherein:
    the first conductivity type is an n-type;
    the second conductivity type is a p-type; and the source wiring portion protrudes toward the trench isolation portion more than the gate electrode in the normal direction.

5. The semiconductor device according to claim 2, wherein:
the first conductivity type is a p-type; and
the second conductivity type is an n-type.

6. The semiconductor device according to claim 1, wherein:
the semiconductor substrate further has a buried insulating film, and
the trench isolation portion directly contacts the buried insulating film.

7. The semiconductor device according to claim 6, wherein:
the semiconductor substrate further has a support substrate, and
the buried insulating film is disposed below the active layer and above the support substrate.

8. The semiconductor device according to claim 1, wherein:
the trench isolation portion extends vertically from the main surface to a bottom surface of the active layer.

9. The semiconductor device according to claim 8, wherein:
the trench isolation portion partitions the active layer into the element region and a field ground region,
the trench isolation portion isolates the element region and the field ground region from each other, and
the field ground region surrounds the element region.

10. The semiconductor device according to claim 8, wherein:
the trench isolation portion partitions laterally the active region.

11. The semiconductor device according to claim 10, wherein:
the trench isolation portion partitions the active layer into the element region and a field ground region,
the trench isolation portion isolates the element region and the field ground region from each other, and
the field ground region surrounds the element region.

12. The semiconductor device according to claim 8, wherein:
the semiconductor substrate further has a buried insulating film, and
the trench isolation portion directly contacts the buried insulating film.

13. The semiconductor device according to claim 9, wherein:
the semiconductor substrate further has a support substrate, and
the buried insulating film is disposed below the active layer and above the support substrate.

14. A semiconductor device forming a laterally-diffused metal-oxide-semiconductor transistor, comprising:
a semiconductor substrate having an active layer, an element region being included in the active layer and partitioned by a trench isolation portion, a main surface of the semiconductor substrate including a surface of the active layer;
a body layer of the first conductivity type disposed at a surface layer portion of the active layer located at the element region;
a source region of a second conductivity type disposed at a surface layer portion of the body layer;
a drift layer of the second conductivity type disposed at the surface layer portion of the active layer located at the element region;
a drain region of the second conductivity type disposed at a surface layer portion of the drift layer;
a gate insulating film disposed on a surface of the body layer;
a gate electrode disposed on the gate insulating film;
a wiring layer disposed on the semiconductor substrate, the wiring layer having a lower layer insulating film, a lower layer wiring portion, an upper layer insulating film, and an upper layer wiring portion; and
a leading wiring layer including
a surface layer insulating film disposed on a top surface of the wiring layer, and
a leading wiring portion having a portion overlapping with the upper layer wiring portion in the normal direction, the leading wiring portion disposed on a top surface of the surface layer insulating film and electrically connected to the source region, wherein:
the lower layer insulation film is disposed on the surface of the active layer, and the upper layer insulation film is disposed on a surface of the lower layer insulation film;
the gate insulating film is included in the lower layer insulation film;
the gate electrode is included in the lower layer wiring portion;
the upper layer wiring portion includes
a source wiring portion disposed above the source region and electrically connected to the source region, and
a drain wiring portion disposed above the drain region and electrically connected to the drain region; and
the upper layer wiring portion is embedded in the upper layer insulating film.

15. The semiconductor device according to claim 1, wherein:
a depth of the drain region from both the main surface and the surface of the active layer is identical to a depth the source region from both the main surface and the surface of the active layer.

* * * * *